United States Patent
Regier

(10) Patent No.: US 7,215,197 B2
(45) Date of Patent: May 8, 2007

(54) PROGRAMMABLE GAIN INSTRUMENTATION AMPLIFIER WITH IMPROVED GAIN MULTIPLEXERS

(75) Inventor: Christopher G. Regier, Austin, TX (US)

(73) Assignee: National Instruments Corporation, Austin, TX (US)

( * ) Notice: Subject to any disclaimer, the term of this patent is extended or adjusted under 35 U.S.C. 154(b) by 141 days.

(21) Appl. No.: 11/205,653

(22) Filed: Aug. 17, 2005

(65) Prior Publication Data

US 2006/0038614 A1 Feb. 23, 2006

Related U.S. Application Data

(60) Provisional application No. 60/602,231, filed on Aug. 17, 2004.

(51) Int. Cl.
*H03F 3/45* (2006.01)

(52) U.S. Cl. .............. 330/254; 330/258; 330/260; 330/278

(58) Field of Classification Search .......... 330/254, 330/258, 260, 278
See application file for complete search history.

(56) References Cited

U.S. PATENT DOCUMENTS

| | | | |
|---|---|---|---|
| 4,319,197 A | * | 3/1982 | Trummer ............... 330/11 |
| 4,518,877 A | * | 5/1985 | Hearn et al. ............ 327/113 |
| 4,833,422 A | | 5/1989 | Atwell |
| 5,157,348 A | | 10/1992 | Deveau |
| 5,233,309 A | | 8/1993 | Spitalny et al. |
| 5,327,098 A | | 7/1994 | Molina et al. |

(Continued)

OTHER PUBLICATIONS

A. S. Sedra and G. W. Roberts; "Current conveyor theory and practice," 1990; Chapter 3, pp. 93-126; Peter Peregrinus Ltd.: London.
"Quick Glossary of commonly used DSA-related terms and acronyms"; 2004; 3 pages; National Instruments Corporation.
Richard House; "Data Acquisition Specifications—a Glossary"; Application Note 092; Feb. 1997; 20 pages; National Instruments Corporation.
Scott Kasin; "Is Your Data Inaccurate Because of Instrumentation Amplifier Settling Time?"; Aug. 1993; 10 pages; National Instruments Corporation.

*Primary Examiner*—Patricia Nguyen
(74) *Attorney, Agent, or Firm*—Meyertons Hood Kivlin Kowert & Goetzel, P.C.; Jeffrey C. Hood

(57) ABSTRACT

In one embodiment, a programmable gain instrumentation amplifier comprises an input stage configured with a differential precision current conveyor circuit. The current conveyor circuit may be implemented with operational amplifiers coupled to gain-setting resistors, with double-multiplexers configured on each end of the gain-setting resistors. In a first set of embodiments, the double-multiplexers may be bootstrapped, whereby the power supplies of each double-multiplexer may track the signals on the output pin of a respective sense-multiplexer component of the double-multiplexer. In a second set of embodiments, the power supplies may alternatively track the op-amp differential output during non-overload conditions, or the op-amp common-mode output at a gain resistor center tap during overload conditions. Corresponding bootstrap circuits may be designed for both sets of embodiments, the bootstrap circuits coupling to the respective tracking node or nodes in either case.

20 Claims, 5 Drawing Sheets

U.S. PATENT DOCUMENTS

| | | |
|---|---|---|
| 6,888,405 B2 | 5/2005 | Cheung et al. |
| 6,958,648 B2 | 10/2005 | Cheung et al. |
| 7,026,875 B2 | 4/2006 | Sobel |
| 7,183,854 B2 * | 2/2007 | Regier et al. ............... 330/284 |
| 5,486,791 A | 1/1996 | Spitalny et al. |
| 5,999,052 A | 12/1999 | Tang |
| 6,018,269 A | 1/2000 | Viswanathan |
| 6,049,252 A | 4/2000 | Iwata |
| 6,278,321 B1 * | 8/2001 | Franck ....................... 330/254 |
| 6,833,759 B2 | 12/2004 | Sobel |
| 6,844,740 B2 | 1/2005 | Hidaka |
| 6,847,904 B2 | 1/2005 | Blake et al. |
| 6,879,215 B1 * | 4/2005 | Roach ........................ 330/292 |

* cited by examiner

PROGRAMMABLE GAIN INSTRUMENTATION AMPLIFIER WITH IMPROVED GAIN MULTIPLEXERS

PRIORITY CLAIM

This application claims benefit of priority of provisional application Ser. No. 60/602,231 titled "Programmable Gain Instrumentation Amplifier with Improved Gain Multiplexers" and filed Aug. 17, 2004, which is hereby incorporated by reference as though fully and completely set forth herein.

BACKGROUND OF THE INVENTION

1. Field of the Invention

This invention relates generally to measurement and data acquisition systems and, more particularly, to instrumentation amplifier design.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal conditioning devices which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a UUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications.

Generally, signals that are being measured using a DAQ system are first routed from a particular channel via a multiplexer. The signals then enter an instrumentation amplifier, typically a programmable gain instrumentation amplifier (PGIA). The PGIA typically applies a specified amount of gain to an input signal, which raises the signal to a higher level and ensures proper A/D conversion. The amplifier may also convert differential input signals applied to the DAQ board to a single-ended output so that the ADC can correctly digitize the data. The ADC may then sample and hold the signal until the signal is digitized and placed into a FIFO buffer on the board. In the FIFO, the digitized signal is ready to be transferred from the board to computer memory via the PC bus for further processing. PGIA performance is generally considered an important aspect of DAQ systems. For example, the PGIA must settle before the A/D conversion takes place or the converted data may be inaccurate. The time needed to amplify the signal to the higher level while maintaining the accuracy of the ADC—in other words, the settling time of the instrumentation amplifier—may also be a concern when using plug-in DAQ boards.

Traditional PGIAs typically use operational amplifiers (op-amps) with multiplexers to switch feedback networks. The gain multiplexers configured as part of the PGIA circuitry are generally considered primary performance limiters due to multiplexer capacitance. Eliminating the capacitive load the multiplexers place on the PGIA circuit can lead to improved performance and potential elimination of large signal distortion, as well as substantial decrease of noise and frequency response aberrations.

Other corresponding issues related to the prior art will become apparent to one skilled in the art after comparing such prior art with the present invention as described herein.

SUMMARY OF THE INVENTION

In one set of embodiments, the input stage of a programmable gain instrumentation amplifier (PGIA) may be implemented using precision current conveyors differentially. Two current conveyors may be configured to sense respective currents on the two sides of a gain resistor. In one embodiment, the input stage of a PGIA may include a pair of operational amplifiers (op-amps), the non-inverting input of each op-amp configured to receive a respective input voltage, and the inverting input of each op-amp configured as a respective feedback input which may also be configured as a sense node for sensing voltage. The input stage may further include a pair of current conveying elements, which may be field effect transistors (FETs), with each FET configured in a respective feedback loop between the output and the feedback input of a respective one of the pair of op-amps. A gain-setting resistive element may be coupled between the respective feedback inputs of the pair of op-amps, and respective currents flowing through the respective FETs may form a differential output current of the PGIA. Respective input voltages received by the respective non-inverting inputs of the pair of op-amps may form a differential input voltage of the PGIA.

In one embodiment, in lieu of a single gain-setting resistive element the input stage of the PGIA may be configured with multiple gain setting resistors from which any one resistor may be selected at a time by a pair of double multiplexers, thereby enabling gain switching. Each double-multiplexer may have a first and a second common pin, and each double multiplexer may be coupled between one end of the multiple gain setting resistors and a respective precision current conveyor. The first component multiplexer may be used to switch the routing of at least a portion of the sense current of a respective precision current conveyor from any currently selected resistor to a newly selected resistor, and the second component multiplexer may be used to switch the sense point of the respective precision current conveyor to the same newly selected resistor.

In one set of embodiments, a bootstrapping circuit may be used in conjunction with each double-multiplexer, where a bootstrapping circuit may be configured to provide a positive power supply voltage and a negative power supply voltage to a respective double-multiplexer, such that the power supplies of the double multiplexer move with the signal on the common pin of the double-multiplexer that couples to the feedback input of the op-amp (or the sense node of the current conveyor). In other words, the voltage supplies provided to the double-multiplexer may track a common pin of the double-multiplexer, providing direct voltage tracking.

In one embodiment, the bootstrapping circuit may comprise a FET source follower circuit configured to drive a two-stage complementary BJT emitter follower circuit. The FET and the first BJT stage may be powered from the outputs of the bootstrapping circuit, thereby reducing capacitive loading. The first BJT stage may be configured using a couple of BJTs, each BJT coupling to a corresponding offset resistor, which may couple to a corresponding biasing current source. One of the two current sources may be configured to develop a DC voltage across its corresponding offset resistor to generate a positive offset, resulting in a corresponding portion of the second BJT stage outputting a positive power rail voltage, which may be provided to the positive supply voltage input of the double-multiplexer. Similarly, the other current source may develop a DC voltage across its corresponding offset resistor to generate a negative offset, resulting in a corresponding portion of the second BJT stage outputting a negative power rail voltage, which may be provided to the negative supply voltage input of the double-multiplexer. A separate bootstrapping circuit may be used to deliver the respective supply voltages to each double-multiplexer.

In other embodiments, the supply voltages of each double-multiplexer may track the differential op-amp output during non-overload conditions, and a common-mode voltage during overload conditions, providing indirect voltage tracking. In order to provide a common-mode voltage, each selectable gain resistor is configured with a center tap, with the collective center taps forming a single common-mode voltage node. A single current source may be coupled to the single common-mode voltage node. In one embodiment, the differential output of each op-amp is configured with level shifter circuits in order to generate a positive power supply voltage and a corresponding negative power supply voltage to be provided to the appropriate voltage supply inputs of the corresponding double multiplexer. In case of an overload, the common-mode voltage node may provide the correct potential to track. A pair of diodes may be configured to select the greater (or lesser, depending on the implementation of the circuit) of the two voltages, that is, of the common-mode voltage and the differential voltage output of a corresponding op-amp, thereby insuring that the multiplexer power supplies track properly in both overloaded and non-overloaded conditions.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
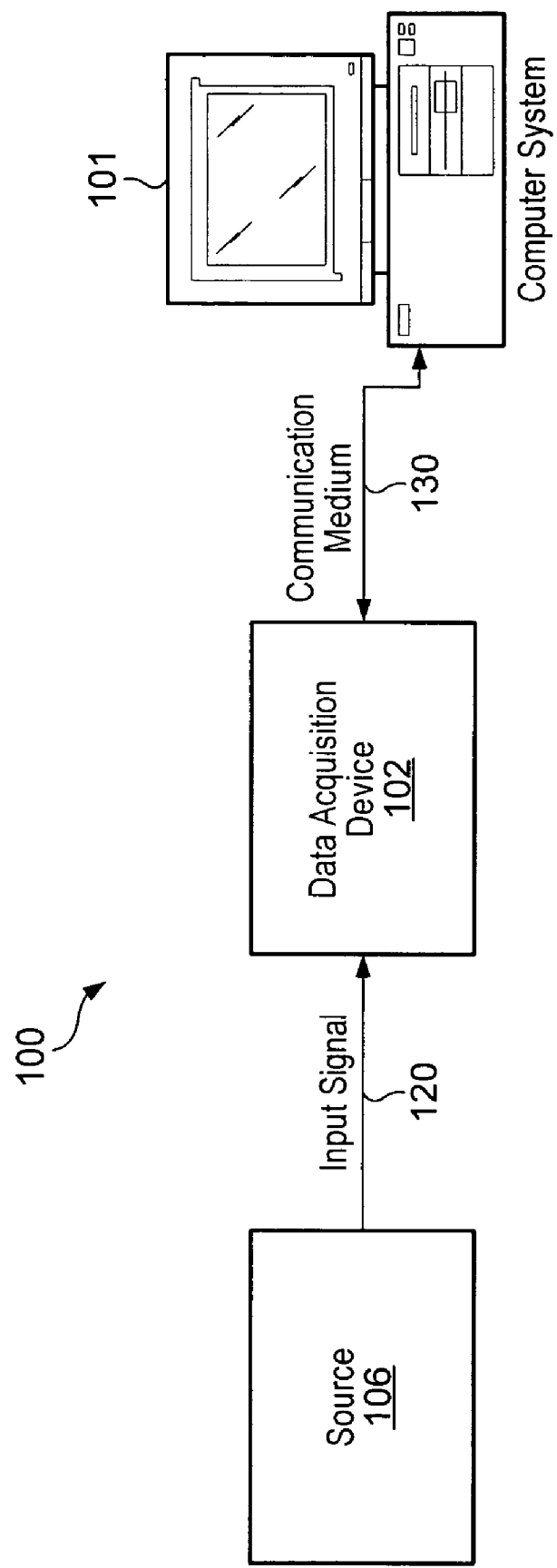
FIG. 1 is a diagram of one embodiment of a computer-based measurement system or data acquisition system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE PREFERRED EMBODIMENTS

As used herein, a "bootstrap" circuit or "bootstrapping" circuit refers to a circuit configured to drive the power rails of a specified circuit or specified sub-circuit with a signal that is substantially similar to the signal the specified circuit is configured to process, in order to make the signal appear small to the circuit. This may allow the specified circuit to operate in a more linear manner and to present a more manageable load to the signal. Furthermore, a "double multiplexer" refers to two multiplexers switching in concert, that is, the two multiplexers are selecting the same corresponding channels at the same time. For example, a signal may be an input to a first channel of a first multiplexer and another signal may be an input to a first channel of a second multiplexer. Then, whenever the first multiplexer is operated to select its respective first channel, the second multiplexer is operated to simultaneously select its own respective first channel. In some embodiments, the same input may be coupled to respective corresponding channels of the two multiplexers, for example a single signal may be an input to the first channel of the first multiplexer and to the first channel of the second multiplexer. In addition, a "common terminal" or "common pin" of a multiplexer refers to the terminal or pin to which the multiplexer may couple any selected one of its channels, thereby coupling to the common terminal or common pin any signals and/or inputs that may be coupled to the selected channel.

In addition, a "current conveyor" refers to a three-terminal device configured such that a voltage applied at the first terminal of the device is substantially reproduced at the second terminal of the device, and a current applied at the second terminal of the device is substantially reproduced at the third terminal of the device. A "current conveying element" may refer to any circuit element and/or component that may exhibit characteristics of a current conveyor. For example, a field effect transistor (FET) may be considered a current conveying element if the gate of the FET is configured as the first terminal of a current conveyor, the source of the FET is configured as the second terminal of the current conveyor, and the drain of the FET is configured as the third terminal of the current conveyor. In addition, in some embodiments, the first terminal may be referred to as the "input" of the current conveyor, the second terminal may be referred to as the "sense node" of the current conveyor, and the third terminal may be referred to as the "output" of the current conveyor.

FIG. 1 is a diagram of one embodiment of a computer-based measurement system or data acquisition system 100. The data acquisition system 100 may comprise a computer system 101, which may be coupled to a measurement device, referred to as data acquisition (DAQ) device 102, through a communication medium 130. The DAQ device 102 may be an internal card or board coupled to a bus, e.g., a Peripheral Component Interconnect (PCI), PCI Express, Industry Standard Architecture (ISA), or Extended Industry Standard Architecture (EISA) bus, but is shown external to the computer 101 for illustrative purposes. The measurement device or DAQ device 102 may also be an external device coupled to the computer system 101. In this embodiment, the communication medium 130 may be a serial bus, such as USB, IEEE 1394, PXI bus, Ethernet, or a proprietary bus, or a parallel bus such as GPIB or others. It is noted that the communication medium 130 may be a wired or wireless communication medium.

The DAQ device 102 may be coupled to an external source 106, such as an instrument, sensor, transducer, or actuator from which the DAQ device 102 may receive an input signal 120, e.g., an analog input such as sensor data. In one example, the external source 106 may be a temperature sensor, which is comprised in a unit under test (UUT). In this example, the DAQ device 102 may receive temperature reading from the temperature sensor and convert the analog data to digital form to be sent to the computer system 101 for analysis. Additionally, the DAQ device 102 may receive a digital input, e.g., a binary pattern, from the external source 106 (e.g., a UUT). Furthermore, the DAQ device 102 may also produce analog or digital signals, e.g., for stimulating the UUT.

The computer system 101 may be operable to control the DAQ device 102. For example, the computer system 101 may be operable to direct the DAQ device 102 to perform an acquisition, and may obtain data from the DAQ device 102 for storage and analysis therein. Additionally, the computer system 101 may be operable to send data to the device 102 for various purposes, such as for use in generating analog signals used for stimulating a UUT.

The computer system 101 may include a processor, which may be any of various types, including an x86 processor, e.g., a Pentium™ class, a PowerPC™ processor, a CPU from the SPARC™ family of RISC processors, as well as others. Also, the computer system 101 may also include one or more memory subsystems (e.g., Dynamic Random Access Memory (DRAM) devices). The memory subsystems may collectively form the main memory of computer system 101 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the DAQ device 102 accordingly.

Figure 2:
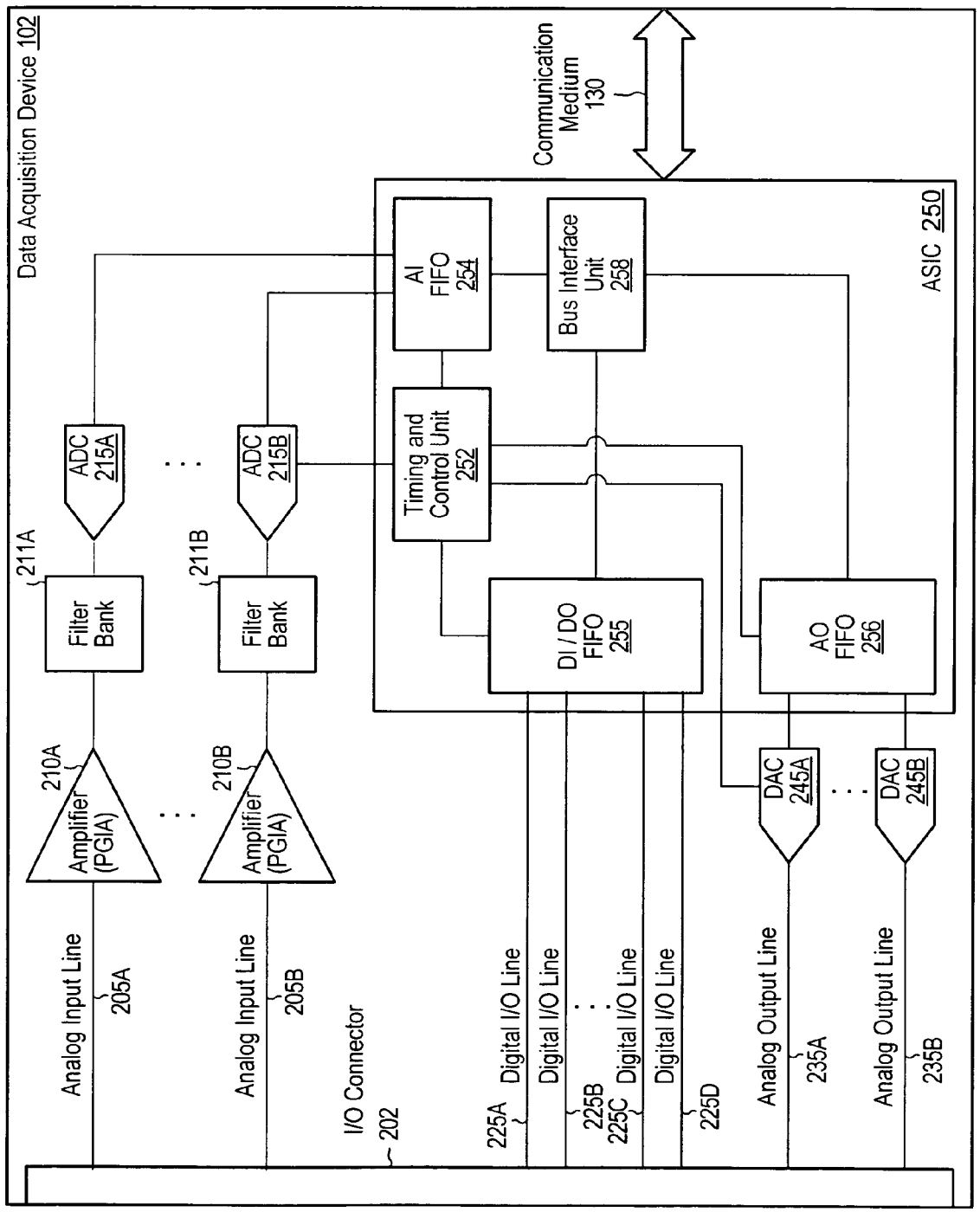
FIG. 2 is a block diagram of one embodiment of a data acquisition (DAQ) device.

FIG. 2 is a block diagram of one embodiment of a data acquisition (DAQ) device 102. Components that correspond to those shown in FIG. 1 are numbered identically for simplicity and clarity. As described above, the DAQ device 102 may be an internal device coupled to, e.g., a PCI bus, or may also be an external device coupled to the computer system 101 via a serial bus, e.g., PXI bus, or a parallel bus, e.g., a GPIB. The DAQ device 102 may be a board or a module comprising one or more integrated circuits (ICs) or the DAQ device 102 may be an IC, for example, a mixed-signal IC.

The DAQ device 102 may comprise an input/output (I/O) connector 202, analog input lines 205A and 205B, amplifiers 210A and 210B, analog-to-digital converters (ADCs) 215A and 215B, digital I/O lines 225A, 225B, 225C, and 225D, analog output lines 235A and 235B, a timing and data control IC (e.g., application-specific integrated circuit (ASIC) 250), digital-to-analog converters (DACs) 245A and 245B, and communication medium 130. It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired.

The DAQ device 102 may receive and send digital and/or analog data via the input and output lines of the I/O connector 202. For example, the I/O connector 202 may be coupled to a signal source (e.g., source 106 of FIG. 1) comprised in a UUT to receive analog signals. The I/O connector 202 may comprise analog input lines 205A and 205B, which may convey the received analog signals to amplifier 210A and 210B. It is noted however that in other embodiments the DAQ device 102 may comprise any number of analog input lines, e.g., three or more analog input lines.

In one embodiment, amplifiers 210A and 210B may be programmable gain instrumentation amplifiers (PGIAs).

PGIAs are typically differential amplifiers having a high input impedance and a gain that is adjustable through the variation of a single resistor. The amplifier 210A may apply a specified amount of gain to the input signal to ensure proper analog-to-digital conversion. Also, PGIAs may convert differential input signals into single-ended outputs, which may be needed for the ADC (e.g., ADC 215A) to correctly digitize the data. It is noted however that in other embodiments amplifier 210A and/or amplifier 210B may be other types of amplifiers typically used in data acquisition devices. It is also noted that DAQ device 102 may comprise any number of amplifiers, e.g., three or more amplifiers.

The output of amplifier 210A may be connected to ADC 215A, which may digitize the analog signals. ADCs are devices that convert a continuously varying (analog) signal into a discrete (digital) signal. The resolution of the ADC typically indicates the number of discrete values it can produce. For example, if the ADC has an eight-bit resolution, the ADC may be able to encode an analog input to one of 256 discrete values (since $2^8=256$). Each discrete value is derived by sampling the analog signal at a predetermined rate (i.e., the sampling rate of the ADC). More specifically, the signal values at particular time intervals are measured and stored. An ADC typically includes a sample and hold circuit, which holds the input value constant during the time the ADC performs the analog-to-digital conversion, since the ADC cannot make an instantaneous conversion. It is noted however that in other embodiments the DAQ device 102 may comprise any number of ADCs, for example, the DAQ device 102 may include a single ADC or four ADCs.

After the signals are digitized, the ADC 215A may send the digital signals to the ASIC 250. In one embodiment, the ASIC 250 may be a mixed-signal ASIC, which may be configured to perform the timing and data control functions for the DAQ device 102. It is noted however that in other embodiments other types of timing and data control ICs may be used. The ASIC 250 may include a timing and control unit 252, an analog input (AI) first-in first-out (FIFO) buffer 254, a digital input (DI)/digital output (DO) FIFO buffer 255, an analog output (AO) FIFO buffer 256, and a bus interface unit 258. It is noted that in other embodiments one or more of the components described may be omitted, combined, modified, or additional components included, as desired.

When the ASIC 250 receives the digitized signals, the data may be stored in AI FIFO buffer 254. FIFO buffers are storage devices that output the stored data in the order the data was received. After being stored in the AI FIFO buffer 254, the digitized data may be sent to the bus interface unit 258. In one embodiment, the bus interface unit 258 may be coupled to the communication medium 130 for sending data to and receiving data from a computer system (e.g., computer system 101 of FIG. 1). The bus interface unit 258 may be operable to implement the protocol associated with the type of bus coupled to the DAQ device 102. As described above, exemplary buses coupled to the bus interface unit 258 include a PCI, PCI Express, USB, IEEE 1394, PXI bus, or Ethernet, among others. In one embodiment, the bus interface unit 258 may send the digitized data to the computer system 101 for storage and analysis of the data.

As described above, the computer system (e.g., computer system 101 of FIG. 1) may provide digital signals to the DAQ device 102 to stimulate a UUT. In one embodiment, the digital signals may need to be converted to analog form to stimulate the UUT. Therefore, in this embodiment, after the ASIC 250 of DAQ device 102 receives the digital signals and stores them in AO FIFO buffer 256, the digital data may be transmitted to DAC 245A to be converted to analog form. DACs are devices that convert discrete (digital) signals into continuously varying (analog) signals. For example, if an analog signal was initially converted to digital form, a DAC may be able to reproduce the analog signal if provided with the digital data. However, according to the Nyquist sampling theorem, reproduction is typically only possible if the sampling rate is higher than twice the frequency of the highest output frequency to be reproduced. It is noted that the DAQ device 102 may comprise any number of DACs, for example, other embodiments may include a single DAC or three DACs. After the digital data is converted to analog form, the analog signals may be sent to the I/O connector 202 via the analog output line 235A.

In one embodiment, digital signals may be received at the I/O connector 202. The received digital signals may be sent to the ASIC 250 via one or more of the digital I/O lines 225A–D. In one embodiment, the digital I/O lines 225A–D are general-purpose, bidirectional digital I/O lines, which may be configured to send and receive digital data. When the ASIC 250 receives the digital signals, the data may be stored in the DI/DO FIFO buffer 255. After being stored in the DI/DO FIFO buffer 255, the digital data may be sent to the bus interface unit 258, which may convey the digital data to the computer system 101, as described above. It is noted that digital data received via the bus interface unit 258 may also be stored in DI/DO FIFO buffer 255 before being sent to the I/O connector 202 via one or more of the digital I/O lines 225A–D.

The ASIC 250 may include the timing and control unit 252 to provide timing and control and data management functions for the DAQ device 102 during, e.g., a data acquisition process. The timing and control unit may comprise one or more counter/timers, which may be used in various applications, including counting the occurrences of a digital event, digital pulse timing, and generating square waves and pulses. The timing and control unit 252 may be coupled to one or more of the FIFO buffers (e.g., AO FIFO buffer 256) of the DAQ device 102 to provide timing and control signals for storing data received from, e.g., the bus interface 258 or the ADC 215A, and for sending data to, e.g., DAC 245A. Furthermore, the timing and control unit 252 may be coupled to the ADCs (e.g., ADC 215A) and DACs (e.g., ADC 245A) of the DAQ device 102 to provide timing and control signals for performing the data conversion functions that may be necessary in a data acquisition process.

In one embodiment, the timing and control unit 252 and/or the bus interface unit 258 may be implemented in hardware. In a further embodiment, the timing and control unit 252 and/or the bus interface unit 258 may be implemented in software. In yet another embodiment, the timing and control unit 252 and/or the bus interface unit 258 may be implemented in both hardware and software. In one embodiment, the functionality described above with regard to the timing and control unit 252 and/or the bus interface unit 258 may be distributed across multiple components. In various embodiments, this type of functional distribution may also apply to other components described herein.

Considering PGIAs 210a and 210b, use of a current conveyor structure in a PGIA circuit/design may facilitate maintaining consistent performance of the PGIA, namely consistent linearity and speed, as the gain is increased. A precision current conveyor may provide improved performance over a typical current conveyor by featuring a current conveying element configured in the feedback loop of, for example, an op-amp, which may force its current sensing node to reside precisely at the correct potential. In one set of embodiments, PGIAs 210a and 210b may be constructed using precision current conveyors differentially. That is, PGIA circuits 210a and 210b may each be constructed based on respective precision differential current conveyors sensing current on both sides of a gain-setting resistor or gain-setting resistors.

Figure 3:
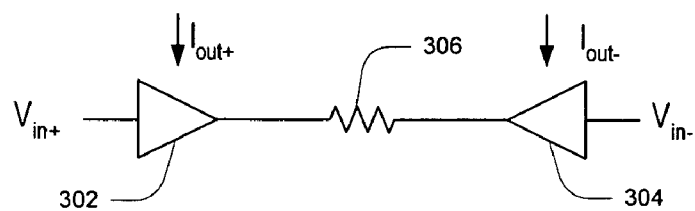
FIG. 3 illustrates one embodiment of a PGIA input circuit configured using a differential current conveyor structure.

One embodiment of the input stage of PGIA 210a and/or PGIA 210b using precision current conveyors differentially is illustrated in FIG. 3. The embodiment of FIG. 3 features a precision differential current conveyor structure that includes precision current conveyors 302 and 304, and currents $I_{out+}$ and $I_{out-}$ that are sensed on the two sides, respectively, of a gain resistor 306. Although a single gain resistor is shown in FIG. 3, gain resistor 306 may be representative of multiple gain resistors forming a single resistive element, where $I_{out+}$ and $I_{out-}$ may be sensed on the two sides, respectively, of the single resistive element. The transconductance of the structure shown in FIG. 3 may be expressed by the proportional relationship $$\text{Transconductance} \approx I_{out\_diff}/V_{in\_diff}, \quad (1)$$

where $I_{out\_diff}$ represents the differential output current, and $V_{in\_diff}$ represents the differential input voltage.

Figure 4:
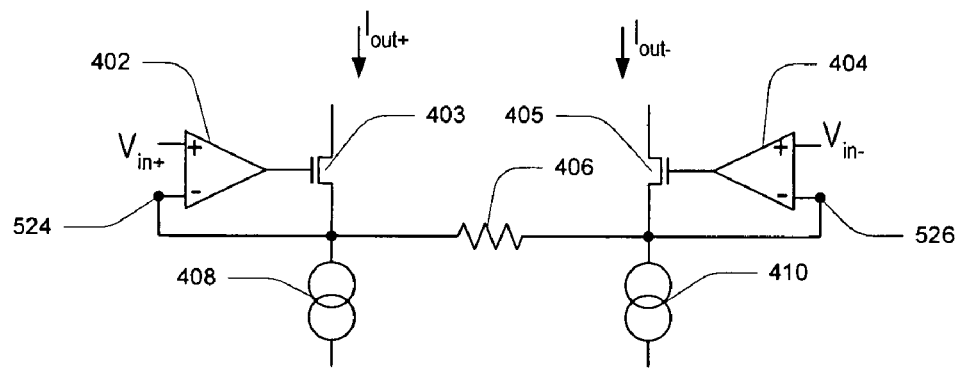
FIG. 4 illustrates one embodiment of the structure of FIG. 3 using op-amps.

One embodiment of the structure of FIG. 3 using op-amps is shown in FIG. 4. By way of example, precision current conveyor 302 may be formed using op-amp 402 whose output may be configured to drive the gate of transistor 403, with the source of transistor 403 coupled to biasing current source 408. Precision current conveyor 304 may be similarly formed using op-amp 404, transistor 405, and biasing current source 410. Current may be sensed on the two sides of gain resistor 406. As previously indicated, transistor 405 configured in the feedback loop of op-amp 404 may operate to keep current sensing node 526 substantially at the desired potential. Similarly, transistor 403 configured in the feedback loop of op-amp 402 may operate to keep current sensing node 524 substantially at the desired potential.

Figure 5:
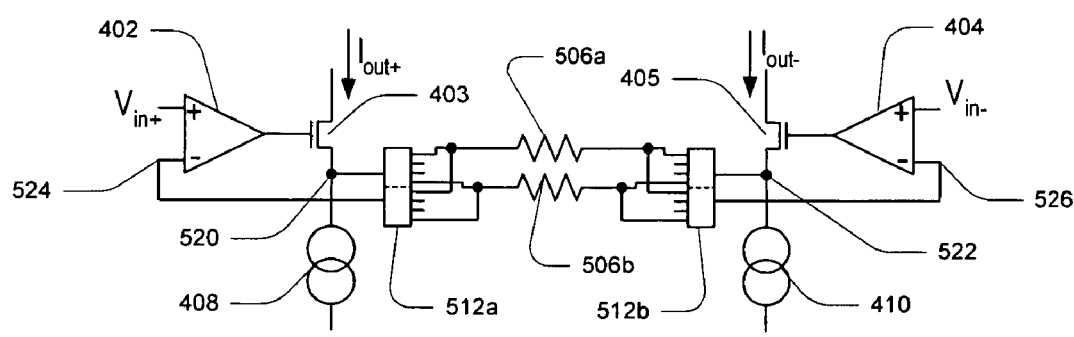
FIG. 5 illustrates one embodiment of the structure of FIG. 3 using double multiplexers at each end of the gain-setting resistors for gain switching.

FIG. 5 shows another embodiment of the structure of FIG. 3. This embodiment is similar to the structure of the circuit in FIG. 4, with the addition of double multiplexers 512a and 512b that are placed at each end of gain-setting resistors 506a and 506b, respectively, for gain switching. Double multiplexers 512a and 512b may be used for switching between gain resistors 506a and 506b, where one component of the double-multiplexer may be used to switch the current from one resistor to another, and the other component of the double-multiplexer may be used to switch the op-amp sense point to the correct resistor. For example, double multiplexer 512a may be configured such that a current-switching multiplexer component of multiplexer 512a switches biasing current source 408—and thus the current flowing through node 520—from gain resistor 506a to gain resistor 506b and/or vice versa, and a sense-multiplexer component of multiplexer 512a switches op-amp 402 sense point 524 to the currently selected one from gain resistors 506a and 506b. Double multiplexer 512b may be similarly configured for biasing-current source 410, current node 522, and op-amp 404 sense point 526.

In the embodiment shown in FIG. 5, op-amps 402 and 404 may operate to compensate for any voltage error(s) that may be incurred by signal currents flowing through the "on" resistance of the current-switching multiplexer component of their respective double multiplexer (512a or 512b). In one embodiment, the respective sense-multiplexer components of multiplexers 512a and 512b carry no signal current, so they are not operable to introduce a voltage error. A double multiplexer may be used on each side of the gain-setting resistors, for a grand total of four gain multiplexers switching in concert, as embodied by double multiplexer 512a configured on the left side of gain-setting resistors 506a and 506b, and double multiplexer 512b configured on the right side of gain-setting resistors 506a and 506b. Double multiplexers 512a and 512b may be bootstrapped in order to substantially eliminate the capacitive load the multiplexers may present to the circuit, thereby substantially eliminating large signal distortion that may result from the capacitive load.

Figure 6:
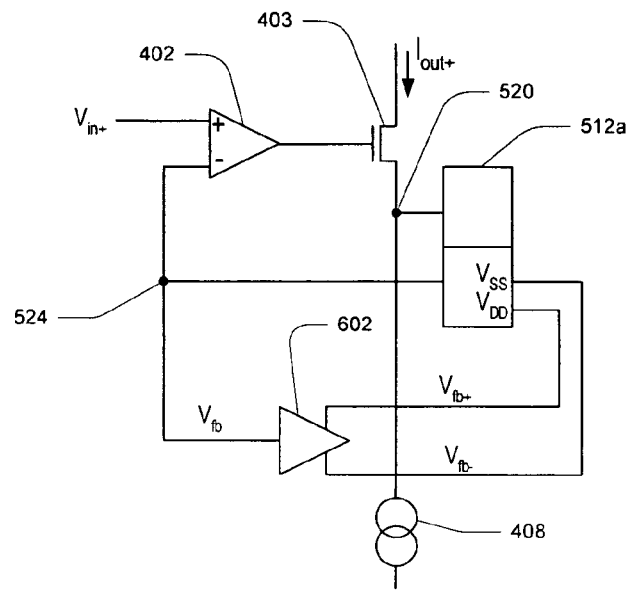
FIG. 6 shows one embodiment of a multiplexer bootstrapping concept with the voltage supplies tracking the multiplexer common pin.

FIG. 6 shows a partial rendering of the circuit from FIG. 5, illustrating a bootstrapping circuit 602 coupled to double multiplexer 512a. Bootstrapping circuit 602 may be configured to provide positive power supply voltage $V_{fb+}$ to multiplexer 512a, shown to be coupling to the $V_{DD}$ input of multiplexer 512a, and negative power supply voltage $V_{fb-}$, shown to be coupling to the $V_{SS}$ input of multiplexer 512a. In the embodiment shown in FIG. 6, the power supplies $V_{SS}$ and $V_{DD}$ of multiplexer 512a may therefore move with the signal on common pin 524 of multiplexer 512a. In other words, voltage supplies $V_{DD}$ and $V_{SS}$ may track common pin 524 of multiplexer 512a, providing direct voltage tracking. Common pin 524 of the sense-multiplexer component of multiplexer 512a may be chosen as the tracking pin since it may be of the same potential as one end of the gain-setting resistor (506a or 506b in FIG. 5). While common pin 520 of the current-switching (upper) component of multiplexer 512a may also be considered as the tracking pin, it may move slightly with respect to the signal because of multiplexer resistance, thus using pin 520 as the tracking pin may result in slightly higher distortion.

Figure 7:
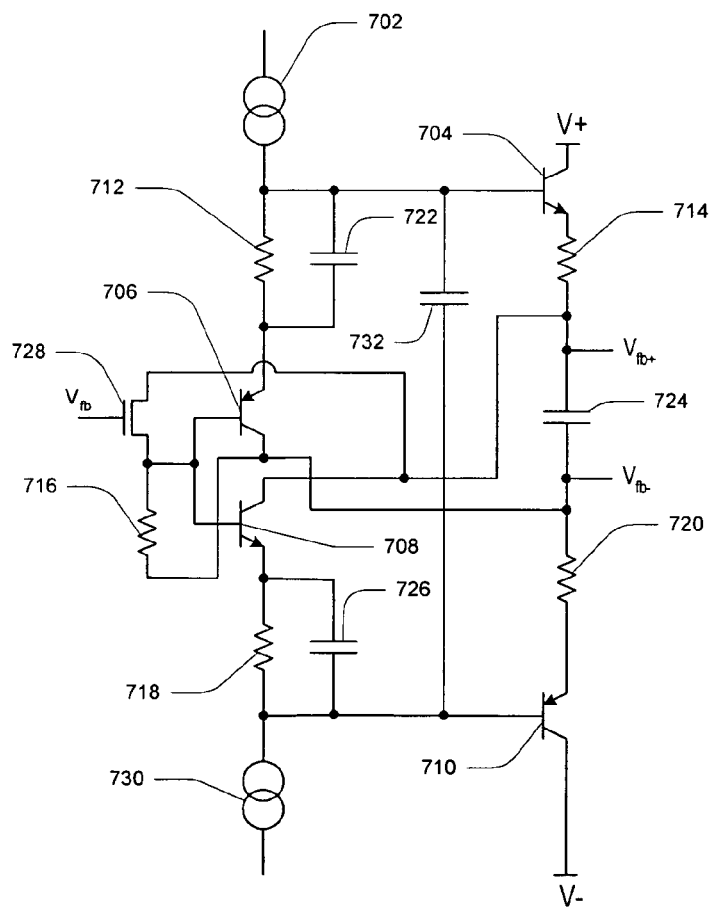
FIG. 7 shows one embodiment of bootstrapping circuit 602 of FIG. 6.

One embodiment of bootstrapping circuit 602 is illustrated in FIG. 7. While the bootstrapping circuits are shown for only one side of the PGIA input stage presented in FIG. 5, it should be understood that similar circuits may be implemented for both the Vin+ and Vin− portions of the entire circuit. As shown in FIG. 7, a FET source follower, configured with FET 728, may drive a two-stage complementary emitter follower, the first stage configured with BJTs 706 and 708, and the second stage configured with BJTs 704 and 710. FET 728 and the first bipolar stage may be powered from the outputs of bootstrapping circuit 602, thereby reducing capacitive loading. Current source 702 may develop a DC voltage across resistor 712 to generate a positive offset, resulting in positive power rail $V_{fb+}$, which may be provided to the $V_{DD}$ input of multiplexer 512a. Similarly, current source 730 may develop a DC voltage across resistor 718 to generate a negative offset, resulting in negative power rail $V_{fb-}$, which may be provided to the $V_{SS}$ input of multiplexer 512a. It should be understood that a similar circuit may be coupled to the corresponding input and output lines of multiplexer 512b shown in FIG. 5, to provide the supply rail voltages to multiplexer 512b. In certain embodiments, an additional bypass capacitor 732 may be coupled between the base of BJT 704 and the base of BJT 710.

Figure 8:
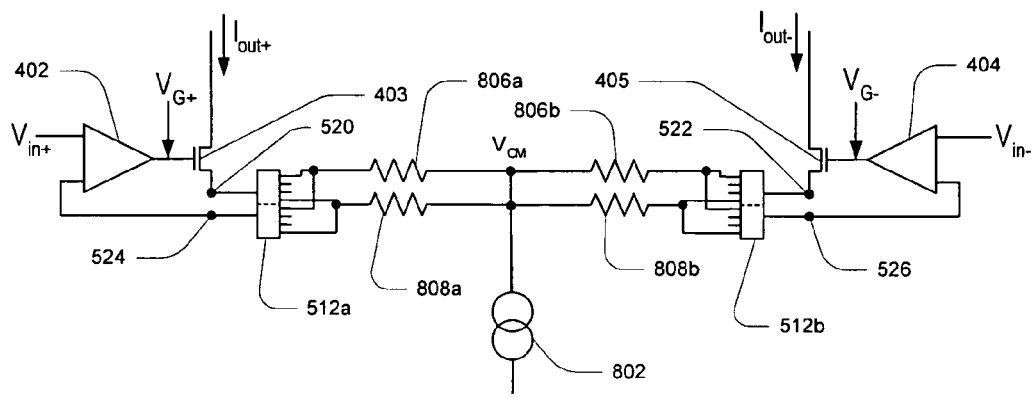
FIG. 8 shows one embodiment of a PGIA input circuit configured using a differential current conveyor structure with double multiplexers at each end of the gain-setting resistors, and a single current source with a gain-resistor center tap.

In another embodiment, voltage supplies $V_{DD}$ and $V_{SS}$ may track the op-amp output, for example the output of op-amp 402 shown in FIG. 6, except during overload, providing indirect voltage tracking. FIG. 8 shows an alternate embodiment of an input stage for PGIA 210a and/or 210b, based on the circuit of the embodiment shown in FIG. 5. As shown in FIG. 8, in order to provide a center tap $V_{CM}$, the equivalent of resistor 506a from FIG. 5 is here represented by resistors 806a and 806b. The other gain resistors selectable by the gain multiplexers are similarly center-tapped. Furthermore, in contrast to the embodiment shown in FIG. 5, the circuit in FIG. 8 features a single current source 802 coupled to the center tap $V_{CM}$, configured between gain resistors 806a and 806b. As long as op-amp 402, in FIG. 8 for example, is not overloaded, the output of op-amp 402 may be at approximately the same potential as common pin 524 of the sense-multiplexer component of multiplexer 512a. The differential output $V_{G+}$ of op-amp 402 may therefore be configured with a level shifter circuit in order to generate power supply voltage $V_{fb+}$ to be provided to the $V_{DD}$ input of multiplexer 512a, and power supply voltage $V_{fb-}$ to be provided to the $V_{SS}$ input of multiplexer 512a, since op-amp 402 features a low impedance output. Similarly, the output of op-amp 404 may be at approximately the same potential as common pin 526 of the sense-multiplexer component of multiplexer 512b, and the differential output $V_{G-}$ of op-amp 404 may therefore be configured with a level shifter circuit in order to generate respective power supply voltages $V_{fb+}$ and $V_{fb-}$ for multiplexer 512b.

Referring again to FIG. 8, in case of an overload, the gain-resistor center tap $V_{CM}$ may provide the correct potential to track. A pair of diodes may be configured to select the greater (or lesser, depending on the implementation of the circuit) of the two voltages, that is, of $V_{CM}$ and $V_{G+}$ for op-amp 402, or $V_{CM}$ and $V_{G-}$ for op-amp 404, thereby insuring that the multiplexer power supplies $V_{DD}$ and $V_{SS}$ track properly in both overloaded and non-overloaded conditions.

Figure 9:
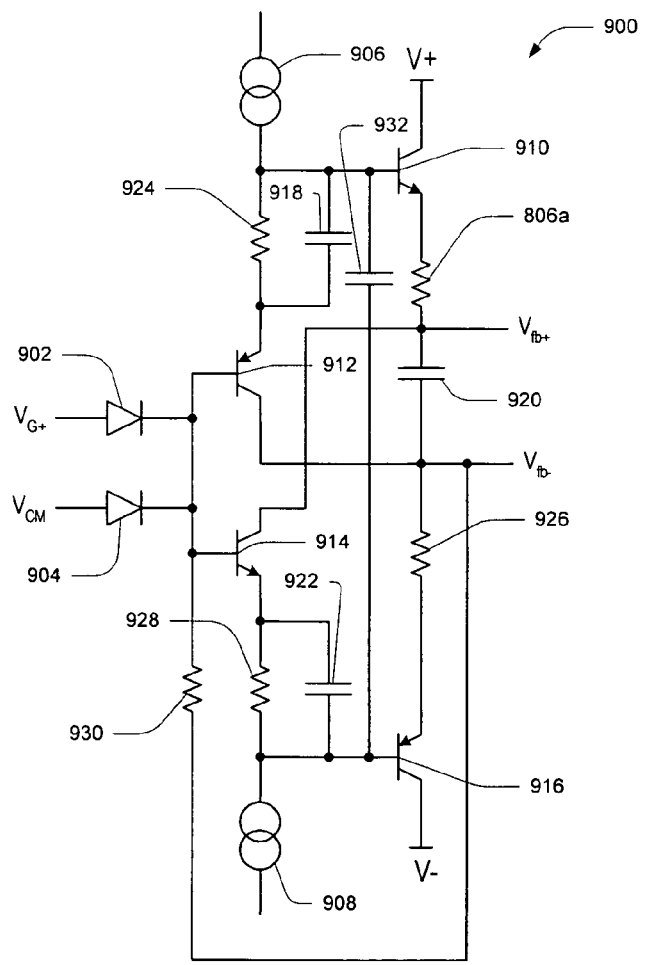
FIG. 9 shows one embodiment of a bootstrapping circuit that provides the power supply voltages to one of the multiplexers for the circuit of FIG. 8.

FIG. 9 shows one embodiment of a bootstrapping circuit 900 providing power supply voltages $V_{fb+}$ and $V_{fb-}$ to multiplexer 512a shown in FIG. 8. As shown in FIG. 9, op-amp 402 outputs $V_{G}+$ (differential signal) and $V_{CM}$ (common mode), also shown in FIG. 8, may be applied to diodes 902 and 904, respectively. As shown in FIG. 9, a two-stage complementary emitter follower comprising BJTs 912, 914, 910 and 916 may be driven by the greater of the two input voltages $V_{G+}$ and $V_{CM}$. Diodes 902 and 904 at the input may select the greater of the two input voltages. The first bipolar stage (comprising BJTs 912 and 914) and diodes 902 and 904 may be biased from the outputs of bootstrapping circuit 900 to reduce capacitive loading. Current source 906 may develop a DC voltage across resistor 924 to generate a positive offset to provide the positive power rail voltage $V_{fb+}$ to the $V_{DD}$ input of multiplexer 512a. Similarly, current source 908 may develop a DC voltage across resistor 928 to generate a negative offset to provide the negative power rail voltage $V_{fb-}$ to the $V_{SS}$ input of multiplexer 512a. In certain embodiments, an additional bypass capacitor 932 may be coupled between the base of BJT 910 and the base of BJT 916. Again, while the bootstrapping circuit is shown only for one side of the circuit ($V_{in+}$), it should be understood that a similar circuit may be implemented for the $V_{in-}$ portion of the entire circuit shown in FIG. 8.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A programmable gain amplifier (PGA) comprising:
a first operational amplifier (op-amp);
a plurality of gain-setting resistors, each gain-setting resistor having two ends;
a first double-multiplexer having a first common terminal and a second common terminal, wherein the first double-multiplexer is operable to couple, through its first common terminal, one end of any selected one of the plurality of gain-setting resistors to a first input of the first op-amp, and wherein the first double-multiplexer is configured to receive a first one or more power supply signals; and
a first bootstrap circuit operable to provide the first one or more power supply signals to the first double-multiplexer, wherein the first one or more power supply signals track a respective signal appearing on the first input of the first op-amp.

2. The PGA of claim 1, wherein the first one or more power supply signals comprise a positive power rail voltage and a negative power rail voltage;
wherein the first bootstrap circuit comprises:
a first offset resistor and a second offset resistor each having two ends;
a first stabilizing resistor and a second stabilizing resistor each having two ends;
a field effect transistor (FET), wherein a gate terminal of the FET is configured to couple to the first common terminal of the first double-multiplexer;
a first bipolar junction transistor (BJT), wherein a base terminal of the first BJT is configured to couple to a source terminal of the FET, and wherein an emitter terminal of the first BJT is configured to couple to one end of the first offset resistor;
a second BJT, wherein a base terminal of the second BJT is configured to couple to the source terminal of the FET, and wherein an emitter terminal of the second BJT is configured to couple to one end of the second offset resistor;
a third BJT, wherein a base terminal of the third BJT is configured to couple to the other end of the first offset resistor, and wherein an emitter terminal of the third BJT is configured to couple to one end of the first stabilizing resistor;
a fourth BJT, wherein a base terminal of the fourth BJT is configured to couple to the other end of the second offset resistor, and wherein an emitter terminal of the fourth BJT is configured to couple to one end of the second stabilizing resistor;
a first current source configured to generate a DC voltage across the first offset resistor, thereby producing the positive power rail voltage at the other end of the first stabilizing resistor; and
a second source configured to generate a DC voltage across the second offset resistor, thereby producing the negative power rail voltage at the other end of the second stabilizing resistor.

3. The PGA of claim 2, wherein the FET, the first BJT and the second BJT are configured to be powered from the positive power rail voltage and from the negative power rail voltage, thereby reducing capacitive loading.

4. The PGA of claim 2, wherein the first bootstrap circuit further comprises a bypass capacitor configured to couple between the other end of the first stabilizing resistor and the other end of the second stabilizing resistor.

5. The PGA of claim 2, wherein the first bootstrap circuit further comprises a first bypass capacitor configured to couple between the one end and the other end of the first offset resistor and a second bypass capacitor configured to couple between the one end and the other end of the second offset resistor.

6. The PGA of claim 1 further comprising:
a second op-amp;
a second double-multiplexer having a first common terminal and a second common terminal, wherein the second double-multiplexer is operable to couple, through its first common terminal, the other end of the selected one of the plurality of gain-setting resistors to a first input of the second op-amp, wherein the second double-multiplexer is further configured to receive a second one or more power supply signals; and
a second bootstrap circuit operable to provide the second one or more power supply signals to the second double-multiplexer, wherein the second one or more power supply signals track a respective signal appearing on the first input of the second op-amp.

7. The PGA of claim 6, further comprising:
a first current conveying element configured to couple between an output of the first op-amp and the second common terminal of the first double-multiplexer, and operable to conduct a first current; and
a second current conveying element configured to couple between an output of the second op-amp and the second common terminal of the second double-multiplexer, and operable to conduct a second current;
wherein the first double-multiplexer is operable to couple, through its second common terminal, the one end of the selected one of the plurality of gain-setting resistors to the first current conveying element, thereby receiving at least a portion of the first current from the selected one of the plurality of gain-setting resistors;
wherein the second double-multiplexer is operable to couple, through its second common terminal, the other end of the selected one of the plurality of gain-setting resistors to the second current conveying element, thereby receiving at least a portion of the second current from the selected one of the plurality of gain-setting resistors.

8. The PGA of claim 7, wherein the first op-amp comprises a second input configured to receive a first input voltage, and the second op-amp comprises a second input configured to receive a second input voltage;
wherein the first input voltage and the second input voltage form a differential input voltage to the PGA; and
wherein the first current and the second current form a differential output current of the PGA.

9. A programmable gain amplifier (PGA) comprising:
a first current conveyor;
a plurality of gain-setting resistors, each gain-setting resistor having two ends;
a first multiplexer having a common terminal, wherein the first multiplexer is operable to couple, through its common terminal, one end of any selected one of the plurality of gain-setting resistors to a sense node of the first current conveyor, and wherein the first multiplexer is configured to receive a first one or more power supply signals; and
a first bootstrap circuit operable to provide the first one or more power supply signals to the first multiplexer, wherein the first one or more power supply signals track a respective signal appearing on an input of the first current conveyor.

10. The PGA of claim 9, wherein the first one or more power supply signals track a respective signal appearing on the sense node of the first current conveyor.

11. The PGA of claim 9 further comprising:
a second current conveyor;
a second multiplexer having a common terminal, wherein the second multiplexer is operable to couple, through its common terminal, the other end of the selected one of the plurality of gain-setting resistors to a sense node of the second current conveyor, wherein the second multiplexer is further configured to receive a second one or more power supply signals; and
a second bootstrap circuit operable to provide the second one or more power supply signals to the second multiplexer, wherein the second one or more power supply signals track a respective signal appearing on an input of the second current conveyor.

12. The PGA of claim 11, wherein the second one or more power supply signals track a respective signal appearing on the sense node of the second current conveyor.

13. A programmable gain amplifier (PGA) comprising:
a first op-amp and a second op-amp;
a first plurality of gain-setting resistors and a second plurality of gain-setting resistors, each gain-setting resistor having two ends, wherein a first end of each one of the first plurality of gain-setting resistors and a first end of each one of the second plurality of gain-setting resistors is configured to couple to a common-mode voltage node;
a first double-multiplexer having a first common terminal and a second common terminal, wherein the first double-multiplexer is operable to couple, through its first common terminal, the second end of any selected one of the first plurality of gain-setting resistors to a first input of the first op-amp, and wherein the first double-multiplexer is configured to receive a first one or more power supply signals; and
a first bootstrap circuit operable to provide the first one or more power supply signals to the first double-multiplexer, wherein the first one or more power supply signals are operable to:
during non-overload conditions, track a respective signal appearing at an output of the first op-amp; and
during overload conditions, track a respective signal appearing at the common-mode voltage node.

14. The PGA of claim 13, wherein the first one or more power supply signals comprise a positive power rail voltage and a negative power rail voltage;
wherein the first bootstrap circuit comprises:
a first offset resistor and a second offset resistor each having two ends;
a first stabilizing resistor and a second stabilizing resistor each having two ends;
a first diode and a second diode, each having a respective input terminal and a respective output terminal, wherein the input terminal of the first diode is configured to couple to the output of the first op-amp, and wherein the input terminal of the second diode is configured to couple to the common-mode voltage node;
a first BJT, wherein a base terminal of the first BJT is configured to couple to the output terminal of the first diode and to the output terminal of the second diode, and wherein an emitter terminal of the first BJT is configured to couple to one end of the first offset resistor;

a second BJT, wherein a base terminal of the second BJT is configured to couple to the output terminal of the first diode and to the output terminal of the second diode, and wherein an emitter terminal of the second BJT is configured to couple to one end of the second offset resistor;

a third BJT, wherein a base terminal of the third BJT is configured to couple to the other end of the first offset resistor, and wherein an emitter terminal of the third BJT is configured to couple to one end of the first stabilizing resistor;

a fourth BJT, wherein a base terminal of the fourth BJT is configured to couple to the other end of the second offset resistor, and wherein an emitter terminal of the fourth BJT is configured to couple to one end of the second stabilizing resistor;

a first current source configured to generate a DC voltage across the first offset resistor, thereby producing the positive power rail voltage at the other end of the first stabilizing resistor; and a second source configured to generate a DC voltage across the second offset resistor, thereby producing the negative power rail voltage at the other end of the second stabilizing resistor.

15. The PGA of claim 14, wherein the first diode, the second diode, the first BJT and the second BJT are configured to be powered from the positive power rail voltage and from the negative power rail voltage, thereby reducing capacitive loading.

16. The PGA of claim 14, wherein the first bootstrap circuit further comprises a bypass capacitor configured to couple between the other end of the first stabilizing resistor and the other end of the second stabilizing resistor.

17. The PGA of claim 14, wherein the first bootstrap circuit further comprises a first bypass capacitor configured to couple between the one end and the other end of the first offset resistor and a second bypass capacitor configured to couple between the one end and the other end of the second offset resistor.

18. The PGA of claim 13, further comprising:
a second double-multiplexer having a first common terminal and a second common terminal, wherein the second double-multiplexer is operable to couple, through its first common terminal, the second end of any selected one of the second plurality of gain-setting resistors to a first input of the second op-amp, and wherein the second double-multiplexer is configured to receive a second one or more power supply signals; and a second bootstrap circuit operable to provide the second one or more power supply signals to the second double-multiplexer, wherein the second one or more power supply signals are operable to:
during non-overload conditions, track a respective signal appearing at an output of second op-amp; and
during overload conditions, track a respective signal appearing at the common-mode voltage node.

19. The PGA of claim 18, further comprising:
a first current conveying element configured to couple between an output of the first op-amp and the second common terminal of the first double-multiplexer, and operable to conduct a first current; and a second current conveying element configured to couple between an output of the second op-amp and the second common terminal of the second double-multiplexer, and operable to conduct a second current;

wherein the first double-multiplexer is operable to couple, through its second common terminal, the second end of the selected one of the first plurality of gain-setting resistors to the first current conveying element, thereby receiving at least a portion of the first current from the selected one of the first plurality of gain-setting resistors;

wherein the second double-multiplexer is operable to couple, through its second common terminal, the second end of the selected one of the second plurality of gain-setting resistors to the second current conveying element, thereby receiving at least a portion of the second current from the selected one of the second plurality of gain-setting resistors.

20. The PGA of claim 19, wherein the first op-amp comprises a second input configured to receive a first input voltage, and the second op-amp comprises a second input configured to receive a second input voltage;
wherein the first input voltage and the second input voltage form a differential input voltage to the PGA; and
wherein the first current and the second current form a differential output current of the PGA.

* * * * *